(12) United States Patent
Nagahama et al.

(10) Patent No.: US 9,780,274 B2
(45) Date of Patent: Oct. 3, 2017

(54) LIGHT-EMITTING APPARATUS AND ILLUMINATION APPARATUS

(71) Applicant: Panasonic Intellectual Property Management Co., Ltd., Osaka (JP)

(72) Inventors: Katsuyuki Nagahama, Hyogo (JP); Hiroshi Yamaguchi, Osaka (JP); Toshifumi Ogata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/246,129

(22) Filed: Aug. 24, 2016

(65) Prior Publication Data

US 2017/0069805 A1 Mar. 9, 2017

(30) Foreign Application Priority Data

Sep. 3, 2015 (JP) .................... 2015-173671

(51) Int. Cl.

| H01L 33/62 | (2010.01) |
|---|---|
| H01L 23/31 | (2006.01) |
| H01L 33/52 | (2010.01) |
| H01L 27/15 | (2006.01) |
| H01L 33/54 | (2010.01) |
| H01L 25/075 | (2006.01) |

(52) U.S. Cl.
CPC .............. *H01L 33/62* (2013.01); *H01L 23/31* (2013.01); *H01L 25/0753* (2013.01); *H01L 27/156* (2013.01); *H01L 33/52* (2013.01); *H01L 33/54* (2013.01); *H01L 2224/48137* (2013.01)

(58) Field of Classification Search
CPC .......... H01L 33/48; H01L 33/52; H01L 33/54; H01L 33/62; H01L 23/26; H01L 23/31; H01L 23/3121
See application file for complete search history.

(56) References Cited

U.S. PATENT DOCUMENTS 9,093,281 B2* 7/2015 Tomohiro ............. H01L 33/382
9,219,203 B2* 12/2015 Hata .................... H01L 25/0753
(Continued)

FOREIGN PATENT DOCUMENTS

| JP | 2011-146640 A | 7/2011 |
|---|---|---|
| JP | 4890576 B2 | 3/2012 |

*Primary Examiner* — Eduardo A Rodela
(74) *Attorney, Agent, or Firm* — McDermott Will & Emery LLP

(57) ABSTRACT

A light-emitting apparatus includes a plurality of light-emitting element columns sealed with a sealing member, each including a plurality of light-emitting elements. In at least one of the plurality of light-emitting element columns, the plurality of light-emitting elements are all positioned or a virtual straight line. At least one of the plurality of light-emitting element columns includes at least one set of a first light-emitting element and a second light-emitting element that are positioned adjacent to each other. The first light-emitting element is disposed to form a first angle between the virtual straight line and a longitudinal direction of the first light-emitting element. The second light-emitting element is disposed to form a second angle different from the first angle between the virtual straight line and a longitudinal direction of the second light-emitting element.

10 Claims, 9 Drawing Sheets

(56) References Cited

U.S. PATENT DOCUMENTS

| | | | |
|---|---|---|---|
| 2010/0102336 A1* | 4/2010 | Lee | H01L 27/153 |
| | | | 257/88 |
| 2010/0320483 A1* | 12/2010 | Kadotani | F21K 9/00 |
| | | | 257/88 |
| 2011/0180817 A1* | 7/2011 | Ishizaki | F21V 3/00 |
| | | | 257/88 |
| 2011/0303927 A1 | 12/2011 | Sanpei et al. | |
| 2016/0071830 A1* | 3/2016 | Lin | H01L 25/167 |
| | | | 257/88 |

* cited by examiner

LIGHT-EMITTING APPARATUS AND ILLUMINATION APPARATUS

CROSS REFERENCE TO RELATED APPLICATION

This application claims the benefit of priority of Japanese Patent Application Number 2015-173671 filed on Sep. 3, 2015, the entire content of which is hereby incorporated by reference.

BACKGROUND

1. Technical Field

The present disclosure relates to a light-emitting apparatus in which a light-emitting element is mounted on a substrate, and to an illumination apparatus including the light-emitting apparatus.

2. Description of the Related Art

In a known illumination apparatus, a light-emitting apparatus (a light-emitting module) that uses a semiconductor light-emitting element, such as an LED (light-emitting diode), as a light source is mounted. Specifically, light-emitting apparatus in which a plurality of LEDs mounted on a substrate are surrounded by a light-reflecting resin (hereinafter referred to also as a dam member) is known (for example, see Japanese Unexamined Patent Application Publication No. 2011-146640). In a region surrounded by the dam member, a plurality of LEDs are provided which are electrically connected by a wire, for example, and a sealing member fills the region so as to seal the plurality of LEDs and the wire.

SUMMARY

The sealing member expands and contracts according to a heat change that occurs upon turning on the apparatus to emit light and upon turning off the apparatus to stop emitting light. However, if the sealing member has an uneven surface, the sealing member does not expand and contract evenly as a whole, which may result in disconnection of the wire. Furthermore, the unevenness of a surface of the sealing member may result in illuminating light having uneven color.

Thus, an object of the present disclosure is to provide a light-emitting apparatus and an illumination apparatus in which a surface of a sealing member has an increased degree of flatness so that the occurrence of disconnection of a wire and the generation of illuminating light having uneven color can be reduced.

A light-emitting apparatus according to an aspect of the present disclosure includes: a substrate; a plurality of light-emitting elements mounted on the substrate and each having a rectangular shape in a plan view of the substrate; a dam member provided on the substrate and surrounding the plurality of light-emitting elements; and a sealing member filling a region surrounded by the dam member, and sealing the plurality of light-emitting elements, wherein the plurality of light-emitting elements are arranged in a plurality of light-emitting element columns, in at least one of the plurality of light-omitting element columns, the plurality of light-emitting elements are all positioned on a virtual straight line, and the plurality of light-emitting elements in the at least one of the plurality of light-emitting element columns include at least one set of a first light-emitting element and a second light-emitting element that are positioned adjacent to each other, the first light-emitting element, being disposed to form a first angle between the virtual straight line and a longitudinal direction of the first light-emitting element, and the second light-emitting element being disposed to form a second angle different from the first angle between the virtual straight line and a longitudinal direction of the second light-emitting element.

An illumination apparatus according to another aspect of the present disclosure includes the above-described light-emitting apparatus.

According to the present disclosure, it is possible to increase the degree of flatness of a surface of the sealing member and thereby reduce the occurrence of disconnection of a wire and the generation of illuminating light having uneven color.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, a light-emitting apparatus, etc., according to embodiments are described with reference to the Drawings. Note that each of the embodiments described below shows a general or specific example. The numerical values, shapes, materials, structural elements, the arrangement and connection of the structural elements, steps, the processing order of the steps, etc., shown in the following embodiments are mere examples, and therefore do not limit the present disclosure. As such, among the structural elements in the following embodiments, those not recited in any one of the independent claims which indicate the broadest inventive concepts are described as arbitrary structural elements.

Furthermore, the respective figures are schematic illustrations and are not necessarily precise illustrations. Additionally, in the figures, substantially identical elements are assigned the same reference signs, and there are cases where overlapping descriptions are omitted or simplified.

Embodiment 1

Configuration of Light-Emitting Apparatus

Figure 1:
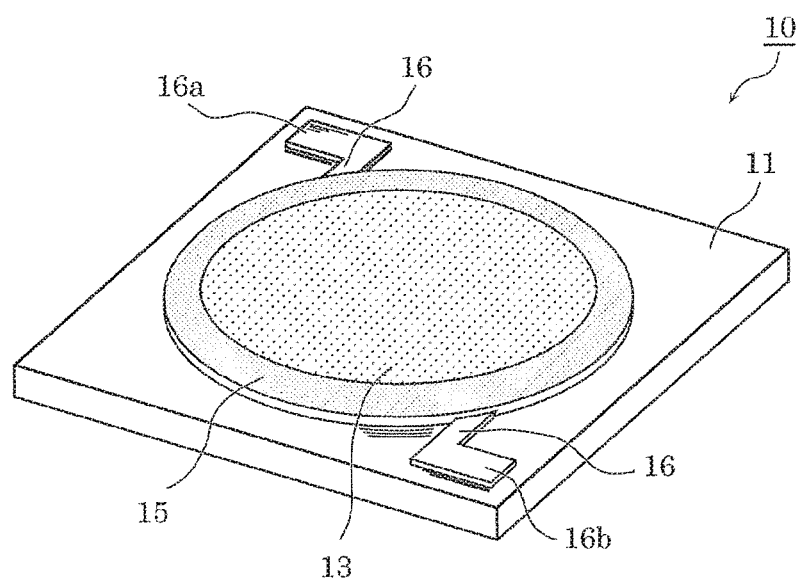
FIG. 1 is a perspective view of an external appearance of a light-emitting apparatus according to Embodiment 1.
Figure 2:
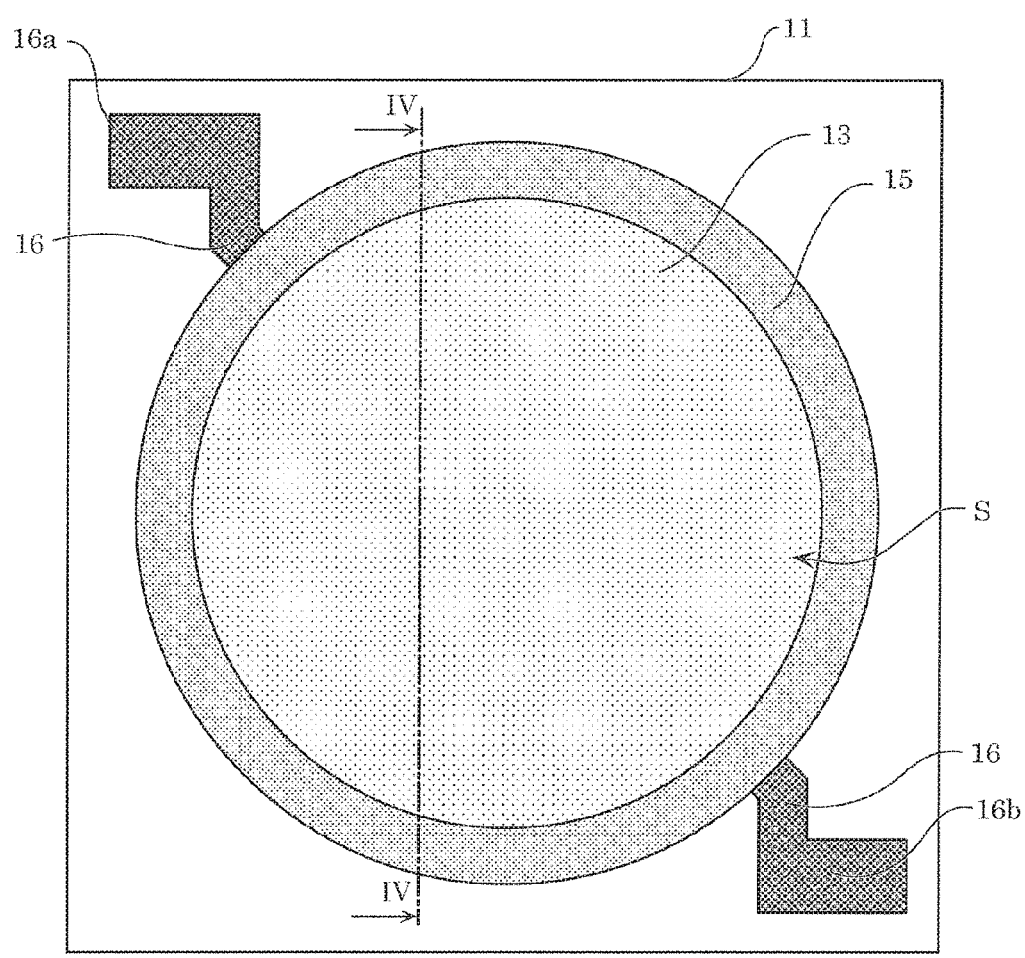
FIG. 2 is a plan view of a light-emitting apparatus according to Embodiment 1.
Figure 3:
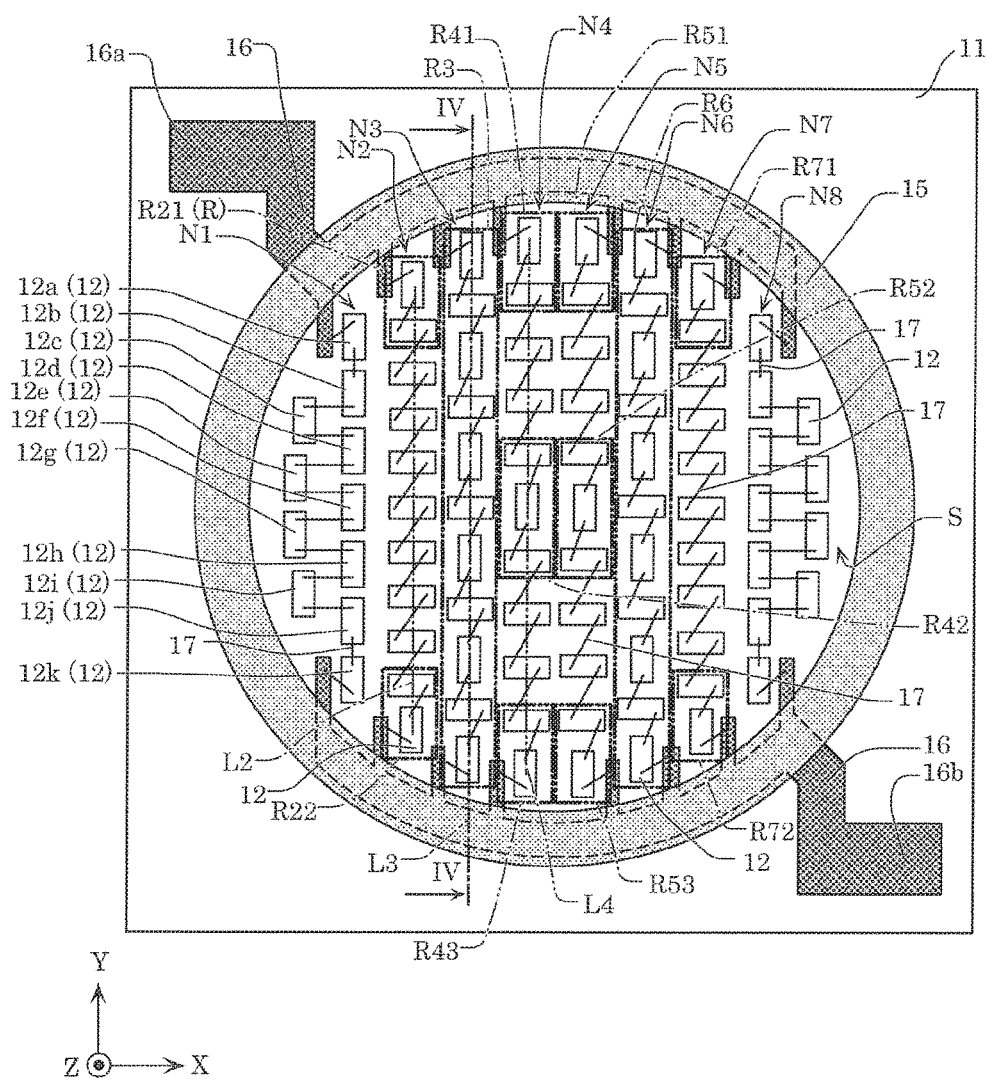
FIG. 3 is a plan view illustrating the internal structure of a light-emitting apparatus according to Embodiment 1.
Figure 4:
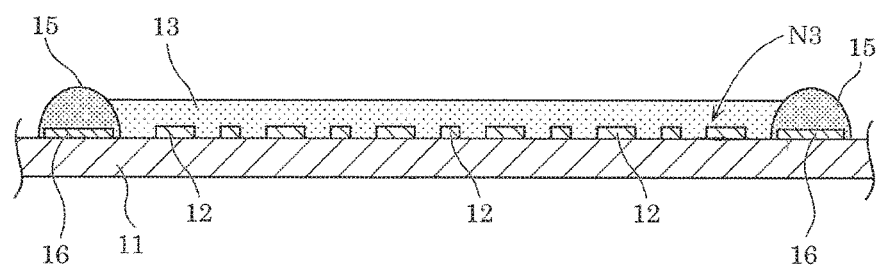
FIG. 4 is a schematic cross-sectional view of a light-emitting apparatus, taken along line IV-IV in FIG. 2.

First, the configuration of a light-emitting apparatus according to Embodiment 1 will be described with reference to the Drawings. FIG. 1 is a perspective view of an external appearance of a light-emitting apparatus according to Embodiment 1. FIG. 2 is a plan view of a light-emitting apparatus according to Embodiment 1. FIG. 3 is a plan view illustrating the internal structure of a light-emitting apparatus according to Embodiment 1. FIG. 4 is a schematic cross-sectional view of a light-emitting apparatus, taken along line IV-IV in FIG. 2. Note that the above-mentioned FIG. 3 is a plan view of the light-emitting apparatus which corresponds to that illustrated in FIG. 2 and illustrates the internal structure thereof including the arrangement of LED chips 12 and a wiring pattern with sealing member 13 removed. Note that the Z-axis is shown as being the vertical direction in these drawings. The Z-axis is exemplified as being the vertical direction in the following description as well, but depending on the mode of use of light-emitting apparatus 10, it is conceivable that the Z-axis may be a direction other than the vertical direction. As such, the Z-axis is not limited to the vertical direction. The same applies to other drawings as well.

Light-emitting apparatus 10 according to Embodiment 1 includes substrate 11, two or more LED chips 12, sealing member 13, and dam member (side sealing member) 15 as illustrated in FIG. 1 to FIG. 4.

Light-emitting apparatus 10 is what is called a COB (chip-on-board) LED module in which LED chips 12 are directly mounted on substrate 11.

Substrate 11 has a wiring region in which wiring 16 is provided. Note that wiring 16 (as well as electrode 16a and electrode 16b) is metal wiring for supplying electric power to LED chips 12. Substrate 11 is, for example, a metal-based substrate or a ceramic substrate. Furthermore, substrate 11 may be a resin substrate that uses a resin as a base material.

An alumina substrate made of aluminum oxide (alumina), an aluminum nitride substrate made of aluminum nitride, or the like is used as the ceramic substrate. An aluminum alloy substrate, an iron alloy substrate, a copper alloy substrate, or the like, the surface of which is coated with an insulating film, for example, is used as the metal-based substrate. A glass-epoxy substrate made of glass fiber and an epoxy resin is used as the resin substrate, for example.

Note that a substrate having a high optical reflectivity (for example, an optical reflectivity of 90% or higher), for example, may be used as substrate 11. Using a substrate having a high optical reflectivity as substrate 11 allows light emitted by LED chips 12 to be reflected on the surface of substrate 11. This results in an increase in the light extraction rate of light-emitting apparatus 10. Examples of the substrate include a white ceramic substrate that uses alumina as a base material.

Alternatively, a light-transmissive substrate having high light transmittance may be used as substrate 11. Examples of the light-transmissive substrate include a light-transmissive ceramic substrate made of polycrystalline alumina or aluminum nitride, a clear glass substrate made of glass, a crystal substrate made of crystal, a sapphire substrate made of sapphire, or a transparent resin substrate made of a transparent resin material.

Note that substrate 11 has a rectangular shape in Embodiment 1, but may have a circular shape or another shape.

LED chip 12 is an example of a light-emitting element having a rectangular shape in a plan view. The rectangular shape herein may be not the shape of a perfect rectangle, but being roughly rectangular is sufficient. For example, a chamfered rectangle and a rectangle with an R-shaped corner may be included.

LED chip 12 is, for example, a blue LED chip which emits blue light. Specifically, a gallium nitride LED chip formed using an InGaN-based material and having a central wavelength (a peak wavelength of the light emission spectrum) in the range from 430 nm to 480 nm is used as LED chip 12.

A plurality of light-emitting element columns including two or more LED chips 12 are provided on substrate 11. From the structural perspective, ten light-emitting element columns are provided on substrate 11 in such a way as to be fit within the shape of a circle as illustrated in FIG. 3.

From the electrical perspective, eight light-emitting element columns each including 11 (eleven) LED chips 12 connected in series are provided on substrate 11. A specific layout of LED chips 12 in each column will be described later.

These eight light-emitting element columns are connected in parallel and emit light with electric power supplied between electrode 16a and electrode 16b.

Although details are not illustrated in the Drawings, LED chips 12 are connected in series in a chip-to-chip configuration mainly by bonding wire 17 (some of LED chips 12 are connected by wiring 16). Bonding wire 17 is a power supply wire connected to LED chips 12. For example, gold (Au), silver (Ag), copper (Cu), or the like is used as a metal material of bonding wire 17 as well as a metal material of wiring 16, electrode 16a, and electrode 16b mentioned above.

Dam member 15 is provided on substrate 11 and serves to block sealing member 13. For example, a thermosetting resin or a thermoplastic resin having an insulating property is used as dam member 15. More specifically, a silicone resin, a phenol resin, an epoxy resin, a BT (bismaleimide-triazine) resin, PPA (polyphthalamide), or the like is used as dam member 15.

In one embodiment, dam member 15 has a light-reflecting property in order to increase the light extraction rate of light-emitting apparatus 10. Thus, a resin in a white color (what is called a white resin) is used as dam member 15 in Embodiment 1. Note that in order to increase the light-reflecting property of dam member 15, particles of $TiO_2$, $Al_2O_3$, $ZrO_2$, MgO, and the like may be contained in dam member 15.

In light-emitting apparatus 10, dam member 15 is formed in a circular annular shape so as to surround two or more LED chips 12 in a top view. Sealing member 13 is provided in a region surrounded by dam member 15 (sealing region 5). With this, it is possible to increase the light extraction rate of light-emitting apparatus 10. The outer shape of dam member 15 may be a rectangular annular shape.

Note that dam member 15 has an effect of reducing light that leaks laterally from LED chip 12 to the outside of light-emitting apparatus 10. Since LED chip 12 emits light mainly upward (toward sealing member 13), a large amount of components of yellow light emitted from yellow phosphor 14 is included in an area lateral to LED chip 12, often resulting in light that does not have a desired emission color being emitted. Dam member 15 serves as a wall against such light, and is thus capable of reducing the occurrence of such light leaking to the outside of light-emitting apparatus 10.

Sealing member 13 seals two or more LED chips 12, bonding wire 17, and part of wiring 16. Specifically, sealing member 13 is formed of a light-transmissive resin material containing yellow phosphor 14 as a wavelength converting element. As the light-transmissive resin material, a methyl-based silicone resin is used, for example, but an epoxy resin, a urea resin, or the like may be used.

Yellow phosphor 14 is one example of a phosphor (phosphor particles) and is excited by the light emitted from LED chip 12 and emits yellow fluorescent light. For example, an yttrium aluminum garnet (YAG)-based phosphor is used as yellow phosphor 14.

In this configuration, the wavelength of a portion of the blue light emitted from LED chips 12 is converted by yellow phosphor 14 contained in sealing member 13, so that the portion is transformed into yellow light. Then, the blue light, not absorbed by yellow phosphor 14 and the yellow light resulting from the wavelength conversion by yellow phosphor 14 are diffused and mixed within sealing member 13. Consequently, white light is emitted from sealing member 13.

Layout of LED Chips

As illustrated in FIG. 3, eight light-emitting element columns are referred to as first light-emitting element column N1, second light-emitting element column N2, third light-emitting element column N3, fourth light-emitting element column N4, fifth light-emitting element column N5, sixth light-emitting element column N6, seventh light-emitting element column N7, and eighth light-emitting element column N8, sequentially from the negative side to the positive side of the X-axis in FIG. 3. These light-emitting element columns N1 to N8 are spaced apart in the row direction (along the X-axis).

LED chips 12 in each column are referred to as first LED chip 12a, second LED chip 12b, third LED chip 12c, fourth LED chip 12d, fifth LED chip 12e, sixth LED chip 12f, seventh LED chip 12g, eighth LED chip 12h, ninth LED chips 12i, tenth LED chip 12j, and eleventh LED chip 12k, sequentially from the negative side to the positive side of the Y-axis in FIG. 3. Note that reference signs 12a to 12k to be assigned to LED chips 12 in second light-emitting element column N2, to eighth light-emitting element column N8 are omitted in FIG. 3.

First light-emitting element column N1 includes two lines along the Y-axis, in one of which each of first LED chip 12a to eleventh LED chip 12k is disposed, from the structural perspective. In one of the two lines that is closer to dam member 15, third LED chip 12c, fifth LED chip 12e, seventh LED chip 12g, and ninth LED chip 12i are arranged. In the other line, first LED chip 12a, second LED chip 12b, fourth LED chip 12d, sixth LED chip 12f, eighth LED chip 12h, tenth LED chip 12j, and eleventh LED chip 12k are arranged.

This arrangement is such that the longitudinal direction of each of first LED chip 12a to eleventh LED chip 12k in first light-emitting element column N1 extends along the Y-axis.

The layout of eighth light-emitting element column N8 is substantially the same as that of first light-emitting element column N1 and therefore, descriptions thereof will be omitted.

In second light-emitting element column N2, first LED chip 12a to eleventh LED chip 12k are all positioned on virtual straight line L2, from the structural perspective; they are arranged in one line. Virtual straight line L2 extends along the Y-axis and connects first LED chip 12a disposed at one end of second light-emitting element column N2 and eleventh LED chip 12k disposed at the other end of second light-emitting element column N2. First LED chip 12a to eleventh LED chip 12k in second light-emitting element column N2 overlap virtual straight line L2 in a plan view.

Furthermore, first LED chip 12a and eleventh LED chip 12k are arranged in second light-emitting element column N2 in such a way that the longitudinal direction of each of these chips extends along virtual straight line L2. Specifically, the angle formed between virtual straight line L2 and the longitudinal direction of each of first LED chip 12a and eleventh LED chip 12k (a first angle) is 180 degrees (or zero degrees). LED chip 12 forming this first angle is a first light-emitting element.

Meanwhile, second LED chip 12b to tenth LED chip 12j are positioned in second light-emitting element column N2 in such a way that the longitudinal direction of each of these chips is perpendicular to virtual straight line L2. Specifically, the angle formed between virtual straight line L2 and the longitudinal direction of each of second LED chip 12b to tenth LED chip 12j (a second angle) is 90 degrees. LED chip 12 forming this second angle is a second light-emitting element. In sum, LED chip 12 that is the first light-emitting element and LED chip 12 that is the second light-emitting element are positioned in such a way that the longitudinal directions thereof are perpendicular to each other.

In second light-emitting element column N2, first LED chip 12a and second LED chip 12b disposed to form different angles between virtual straight line L2 and the respective longitudinal directions of first LED chip 12a and second LED chip 12b are adjacent to each other, and likewise, tenth LED chip 12j and eleventh LED chip 12k disposed to form different angles between virtual straight line L2 and the respective longitudinal directions of tenth LED chip 12j and eleventh LED chip 12k are adjacent to each other. Two sets of LED chips 12 in the above-described relationship are provided in second light-emitting element column N2.

The layout of seventh light-emitting element column N7 is substantially the same as that of second light-emitting element column N2 and therefore, descriptions thereof will be omitted.

In third light-emitting element column N3, first LED chip 12a to eleventh LED chip 12k are all positioned on virtual straight line L3 (line IV-IV), from the structural perspective; they are arranged in one line. Virtual straight line L3 extends along the Y-axis and connects first LED chip 12a disposed at one end of third light-emitting element column N3 and eleventh LED chip 12k disposed at the other end of third light-emitting element column N3. First LED chip 12a to eleventh LED chip 12k in third light-emitting element column N3 overlap virtual straight line L3 in a plan view.

In third light-emitting element column N3, odd-numbered LED chip 12 (first LED chip 12a, third LED chip 12c, fifth LED chip 12e, seventh LED chip 12g, ninth LED chip 12i, and eleventh LED chip 12k) is the first light-emitting element that is positioned in such a way that the longitudinal direction thereof extends along virtual straight line L3.

Meanwhile, in third light-emitting element column N3, even numbered LED chip 12 (second LED chip 12b, fourth LED chip 12d, sixth LED chip 12f, eighth LED chip 12h, and tenth LED chip 12j) is the second light-emitting element that is positioned in such a way that the longitudinal direction thereof is perpendicular to virtual straight line L3.

Thus, the first light-emitting element and the second light-emitting element are arranged alternately throughout third light-emitting element column N3.

The layout of sixth light-emitting element column N6 is substantially the same as that of third light-emitting element column N3 and therefore, descriptions thereof will be omitted.

In fourth light-emitting element column N4, first LED chip 12a to eleventh LED chip 12k are all positioned on virtual straight line L4, from the structural perspective they are arranged in one line. Virtual straight line L4 extends along the Y-axis and connects first LED chip 12a disposed at one end of fourth light-emitting element column N4 and eleventh LED chip 12k disposed at the other end of fourth light-emitting element column N4. First LED chip 12a to eleventh LED chip 12k in fourth light-emitting element column N4 overlap virtual straight line L4 in a plan view.

In fourth light-emitting element column N4, each of first LED chip 12a, sixth LED chip 12f, and eleventh LED chip 12k is the first light-emitting element; that is positioned in such a way that the longitudinal direction thereof extends along virtual straight line L4.

Meanwhile, in fourth light-emitting element column N4, each of second LED chip 12b, third LED chip 12c, fourth LED chip 12d, fifth LED chip 12e, seventh LED chip 12g, eighth LED chip 12h, ninth LED chip 12i, and tenth LED chip 12j is the second light-emitting element that is positioned in such a way that the longitudinal direction thereof is perpendicular to virtual straight line L4.

The layout of fifth light-emitting element column N5 is substantially the same as that of fourth light-emitting element column N4 and therefore, descriptions thereof will be omitted.

In the illustration in FIG. 3, adjacent LED chips 12 that have different longitudinal directions are surrounded by a two-dot chain line in each of light-emitting element columns N1 to N8. This surrounded part is referred to as mixture region R. Specifically, mixture regions R21 and R71 each including first LED chip 12a and second LED chip 12b and mixture regions R22 and R72 each including tenth LED chip 12j and eleventh LED chip 12k are present in second light-emitting element column N2 and seventh light-emitting element column N7. Entire third light-emitting element column N3 and entire sixth light-emitting element column N6 form mixture region R3 and mixture region R6, respectively. Mixture regions R41 and R51 each including first LED chip 12a and second LED chip 12b, mixture regions R42 and R52 each including fifth LED chip 12e, sixth LED chip 12f, and seventh LED chip 12g, and mixture regions R43 and R53 each including tenth LED chip 125 and eleventh LED chip 12k are present in fourth light-emitting element column N4 and fifth light-emitting element column N5.

As described above, LED chips 12 that have different longitudinal directions are adjacent to each other in mixture region R. Comparison between mixture region R and a region in which LED chips 12 that have the same longitudinal direction are adjacent to each other shows that package density of LED chips 12 in each of these regions is different. Furthermore, the distance between one LED chip 12 among adjacent LED chips 12 in mixture region R and LED chip 12 in another line is different from the distance between other LED chip 12 among adjacent LED chips 12 in mixture region R and LED chip 12 in such another line.

The following describes this using a specific example of mixture region R21 in second light-emitting element column N2.

Figure 5:
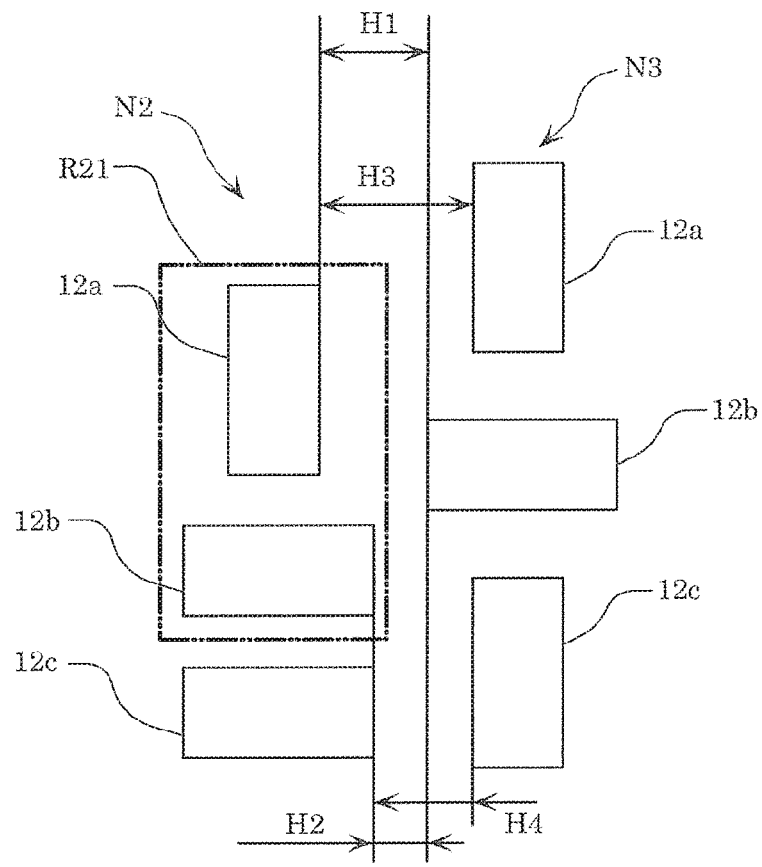
FIG. 5 is an enlarged view of and around a mixture region in a second light-emitting element column according to Embodiment 1.

FIG. 5 is an enlarged view of and around mixture region R21 in second light-emitting element column N2 according to Embodiment 1.

As illustrated in FIG. 5, distance H1 between one LED chip 12, namely, first LED chip 12a, in mixture region R21 and even-numbered LED chip 12 (for example, second LED chip 12b) in third light-emitting element column N3 is greater than distance H2 between other LED chip 12, namely, second LED chip 12b, in mixture region R21 and even-numbered LED chip 12 in third light-emitting element column N3. Likewise, distance H3 between one LED chip 12, namely, first LED chip 12a, in mixture region R21 and odd-numbered LED chip 12 (for example, first LED chip 12a) in third light-emitting element column N3 is greater than distance H4 between other LED chip 12, namely, second LED chip 12b, in mixture region R21 and odd-numbered LED chip 12 in third light-emitting element column N3.

Thus, with mixture region R, the distance between LED chips 12 in adjacent lines can be partially increased.

Method of Manufacturing Light-Emitting Apparatus

Figure 6:
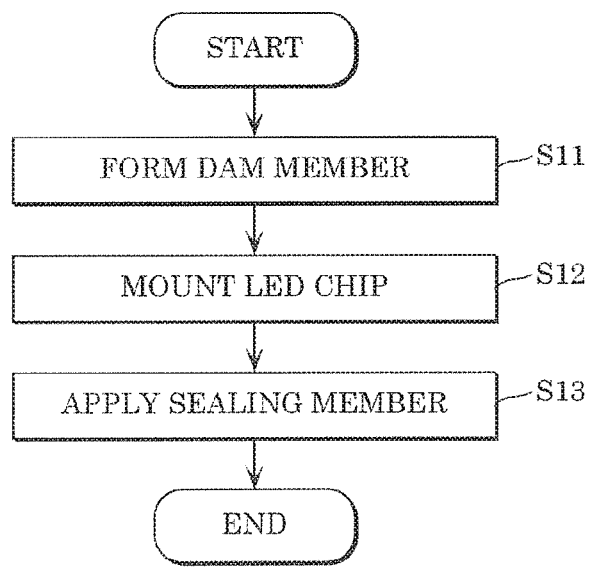
FIG. 6 is a flowchart of a method of manufacturing a light-emitting apparatus according to Embodiment 1.
Figure 7A:
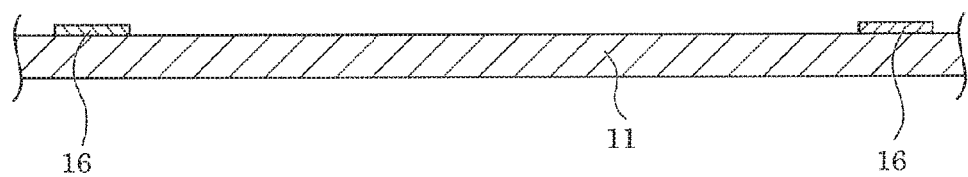
FIG. 7A is a cross-sectional view illustrating one step in a method of manufacturing a light-emitting apparatus according to Embodiment 1.
Figure 7B:
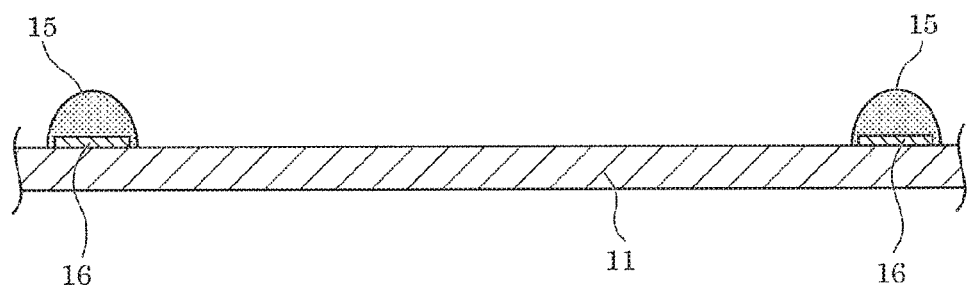
FIG. 7B is a cross-sectional view illustrating one step in a method of manufacturing a light-emitting apparatus according to Embodiment 1.
Figure 7C:
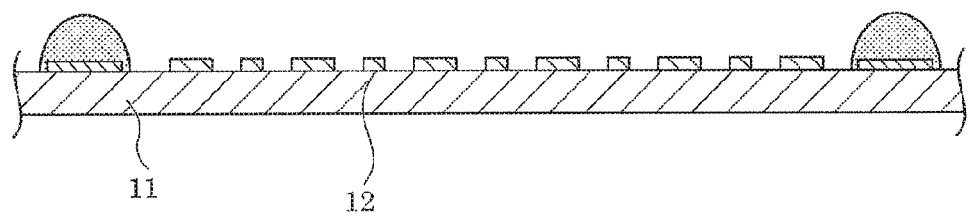
FIG. 7C is a cross-sectional view illustrating one step in a method of manufacturing a light-emitting apparatus according to Embodiment 1.

Next, a method of manufacturing light-emitting apparatus 10 is described. FIG. 6 is a flowchart of a method of manufacturing light-emitting apparatus 10 according to Embodiment 1. FIG. 7A to FIG. 7C are cross-sectional views each illustrating one step in a method of manufacturing light-emitting apparatus 10 according to Embodiment 1. Note that FIG. 7A to FIG. 7C are views corresponding to FIG. 4.

First, on substrate 11 on which wiring 16 has been formed in advance as illustrated in FIG. 7A, dam member 15 is formed as illustrated in FIG. 7B (S11). Dam member 15 is formed in a circular annular shape that is continuous to partially cover wiring 16. A dispenser that releases a white resin is used to form dam member 15.

Next, two or more LED chips 12 are mounted on substrate 11 as illustrated in FIG. 7C (S12). A die-attach material or the like is used to mount LED chips 12 by die bonding. At this time, two or more LED chips 12 are electrically connected to each other by bonding wire 17 and wiring 16.

Sealing member 13 fills (is applied to) sealing region S as illustrated in FIG. 4 (S13). Specifically, a light-transmissive; resin material containing yellow phosphor particles is injected into sealing region 5, in a center part thereof. The light-transmissive resin material flows between LEDs 12, gradually filling sealing region S. At this time, a larger amount of the light-transmissive resin material flows through the space between LEDs 12 that is wide than that flowing through the space that is narrow. This means that disposing mixture region R at an appropriate position allows the light-transmissive resin material to flow evenly into sealing region S.

For example, mixture regions R21, R22, R41, R43, R51, R53, R71, and R72 according to the present embodiment are positioned with an intention to flow as much light-transmissive resin material as possible into the area around dam member 15. Mixture regions R3 and R6 are positioned with an intention to increase fluidity of the light-transmissive resin material along the Y-axis. Mixture regions R42 and R52 are positioned with an intention to flow the light-transmissive resin material from the center of sealing region S evenly along the X-axis and the Y-axis.

Note that an appropriate position of mixture region R can be determined based on various experiments, simulation, experimental rules of operators, and so on.

When the injection of the light-transmissive resin material is completed, the light-transmissive resin material is subject to heating, light irradiation, or the like so as to be cured, forming sealing member 13.

Advantageous Effects, Etc.

As described above, according to the present embodiment mixture region R including one set of adjacent LED chips 12 that have different longitudinal directions is positioned in at least one of light-emitting element columns N1 to N8. The position of this mixture region R is adjusted to control the fluidity of the light-transmissive resin material within sealing region S. Disposing mixture region R at an appropriate position allows the light-transmissive resin material to flow evenly into sealing region S, allowing an increase in the degree of flatness of a surface of sealing member 13. Accordingly, it is possible to reduce the occurrence of disconnection of bonding wire 17 and the generation of illuminating light having uneven color due to unevenness of the surface of sealing member 13.

In mixture region. R, the longitudinal direction of LED chip 12 that is the first light-emitting element is perpendicular to the longitudinal direction of LED chip 12 that is the second light-emitting element. With this, the fluidity along two perpendicular directions (along the X-axis and the Y-axis) can be easily controlled.

Entire third light-emitting element column N3 and entire sixth light-emitting element column N6 form mixture region R3 and mixture region R6, respectively. Specifically, LED chips 12 each of which is the first light-emitting element (first LED chip 12a, third LED chip 12c, fifth LED chip 12e, seventh LED chip 12g, ninth LED chip 12i, and eleventh LED chip 12k) and LED chips 12 each of which is the second light-emitting element (second LED chip 12b, fourth LED chip 12d, sixth LED chip 12f, eighth LED chip 12h, and tenth LED chip 12j) are arranged alternately throughout third light-emitting element column N3 and sixth light-emitting element column N6. With this, it is possible to control the fluidity of the light-transmissive resin material throughout the column.

Furthermore, in the area in which mixture regions R are adjacent to each other in the row direction, there is a set of the first light-emitting element and the second light-emitting element that are adjacent to each other in the row direction. A specific example of such a combination is fifth LED chip 12e in third light-emitting element column N3 forming mixture region R3 and fifth LED chip 12e in fourth light-emitting element column N4 including mixture region R42. In this area, the distance between LED chips 12 in adjacent rows can be partially increased and thus, it is possible to control the fluidity of the light-transmissive resin material in the row direction.

Embodiment 2

Next, light-emitting apparatus 20 according to Embodiment 2 is described with reference to FIG. 8.

Embodiment 1 has described an example where mixture region R in which the first light-emitting element and the second light-emitting element are arranged alternately to be adjacent to each other is provided in part of the columns. Embodiment 2 will describe a case where the first light-emitting element and the second light-emitting element are arranged alternately throughout every one of the plurality of light-emitting element columns. In the following descriptions, elements that are identical to those in Embodiment 1 described above are assigned the same reference signs, and there are cases where descriptions thereof are omitted.

Figure 8:
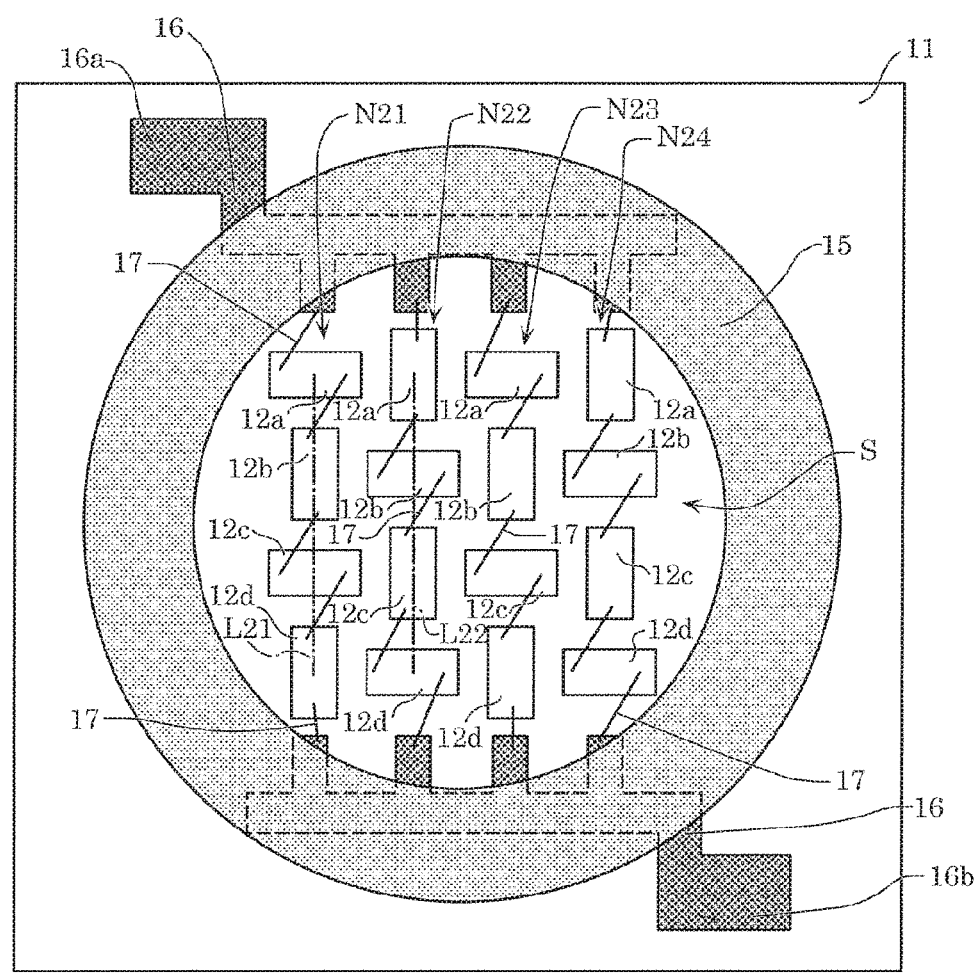
FIG. 8 is a plan view illustrating the internal structure of a light-emitting apparatus according to Embodiment 2.

FIG. 8 is a plan view illustrating the internal structure of light-emitting apparatus 20 according to Embodiment 2. Specifically, FIG. 8 is a view corresponding to FIG. 3. In FIG. 8, the illustration of the sealing member is omitted As illustrated in FIG. 8, four light-emitting element columns each including four LED chips 12 connected in series are provided on substrate 11 of light-emitting apparatus 20. LED chips 12 are arranged in a matrix.

These four light-emitting element columns are referred to as first light-emitting element column N21, second light-emitting element column N22, third light-emitting element column N23, and fourth light-emitting element column N24, sequentially from the negative side to the positive side of the X-axis in FIG. 8.

Furthermore, LED chips 12 in each column are referred to as first LED chip 12a, second LED chip 12b, third LED chip 12c, and fourth LED chip 12d, sequentially from the positive side the negative side of the Y-axis in FIG. 8.

In first light-emitting element column N21, first LED chip 12a to fourth LED chip 12d are all positioned on virtual straight line L21, from the structural perspective; they are arranged in one line. Virtual straight line L21 extends along the Y-axis and connects first LED chip 12a disposed at one end of first light-emitting element column N21 and fourth LED chip 12d disposed at the other end of first light-emitting element column N21. First LED chip 12a to fourth LED chip 12d in first light-emitting element column N1 overlap virtual straight line L21 in a plan view.

Furthermore, in first light-emitting element column N21, odd-numbered LED chip 12 (first LED chip 12a and third LED chip 12c) is the first light-emitting element that is positioned in such a way that the longitudinal direction thereof is perpendicular to virtual straight line L21.

Meanwhile, in first light-emitting element column N21, even-numbered LED chip 12 (second LED chip 12b and fourth LED chip 12d) is the second light-emitting element that is positioned in such a way that the longitudinal direction thereof extends along virtual straight line L21.

Thus, the first light-emitting element and the second light-emitting element are arranged alternately throughout first light-emitting element column N21.

The layout of third light-emitting element column N23 is substantially the same as that of first light-emitting element column N21 and therefore, descriptions thereof will be omitted.

In second light-emitting element column N22, first LED chip 12a to fourth LED chip 12d are all positioned on virtual straight line L22, from the structural perspective; they are arranged in one line. Virtual straight line L22 extends along the Y-axis and connects first LED chip 12a disposed at one end of second light-emitting element column N22 and fourth LED chip 12d disposed at the other end of second light-emitting element column N22. First LED chip 12a to fourth LED chip 12d in second light-emitting element column N22 overlap virtual straight line L22 in a plan view.

Furthermore, in second light-emitting element column N22, odd-numbered LED chip 12 (first LED chip 12a and third LED chip 12c) is the first light-emitting element that is positioned in such a way that the longitudinal direction thereof extends along virtual straight line L22.

Meanwhile, in second light-emitting element column N22, even-numbered LED chip 12 (second LED chip 12b and fourth LED chip 12d) is the second light-emitting element that is positioned in such a way that the longitudinal direction thereof is perpendicular to virtual straight line L22.

Thus, the first light-emitting element and the second light-emitting element are arranged alternately throughout second light-emitting element column N22.

The layout of fourth light-emitting element column N24 is substantially the same as that of second light-emitting element column N22 and therefore, descriptions thereof will be omitted.

As light-emitting element columns N21 to N24 are positioned as just described, the first light-emitting element and the second light-emitting element are arranged alternately, also in the row direction (along the X-axis), throughout each row, Specifically, in the row of first LED chips 12a in light-emitting element columns N21 to N24 (a first row), first LED chips 12a in first light-emitting element column N21 and third light-emitting element column N23 are the second light-emitting element. Meanwhile, in the first row, first LED chips 12a in second light-emitting element column N22 and fourth light-emitting element column N24 are the first light-emitting element.

In the row of second LED chips 12b in light-emitting element columns N21 to N24 (a second row), second LED chips 12b in first light-emitting element column N21 and third light-emitting element column N23 are the first light-emitting element. Meanwhile, in the second row, second LED chips 12b in second light-emitting element, column N22 and fourth light-emitting element column N24 are the second light-emitting element.

In the row of third LED chips 12c in light-emitting element columns N21 to N24 (a third row), third LED chips 12c in first light-emitting element column N21 and third light-emitting element column N23 are the second light-emitting element. Meanwhile, in the third row, third LED chips 12c in second light-emitting element column N22 and fourth light-emitting element column N24 are the first light-emitting element.

In the row of fourth LED chips 12d in light-emitting element columns N21 to N24 (a fourth row), fourth LED chips 12d in first light-emitting element column N21 and third light-emitting element column N23 are the first light-emitting element. Meanwhile, in the fourth row, fourth LED chips 12d in second light-emitting element column N22 and fourth light-emitting element column N24 are the second light-emitting element.

Figure 9:
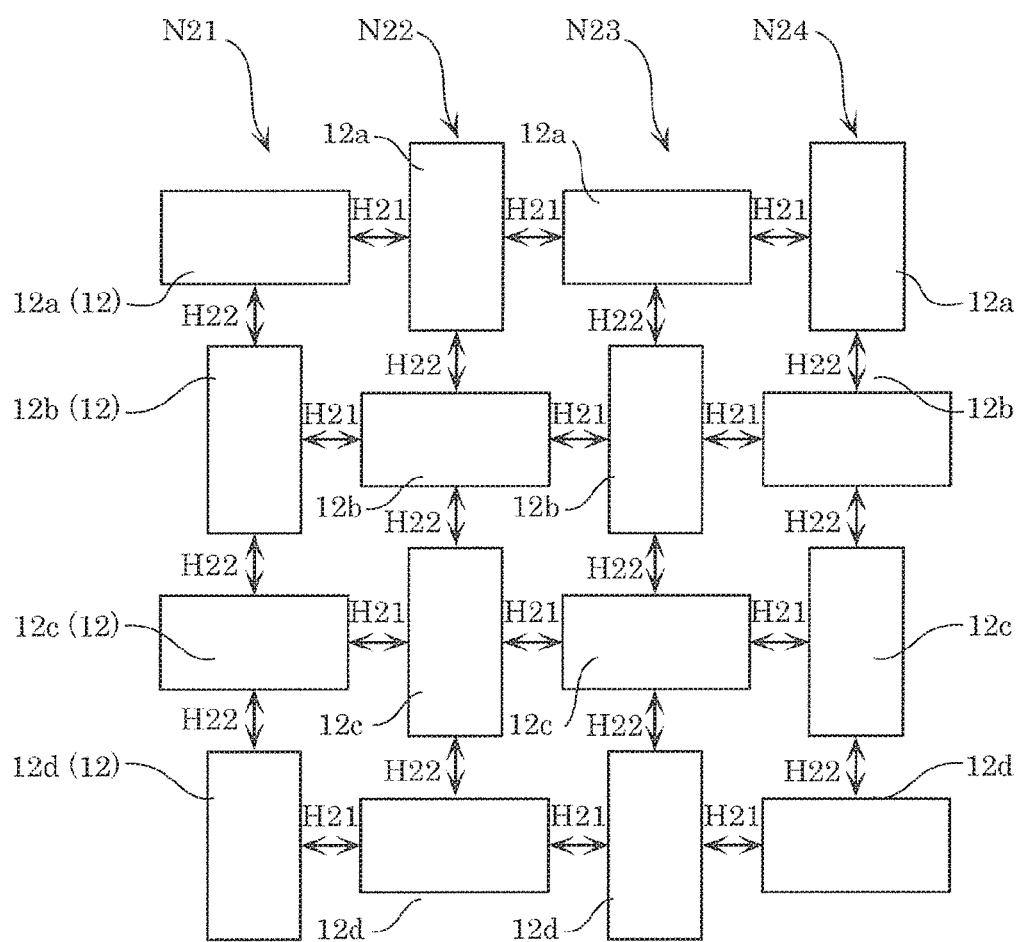
FIG. 9 is a plan view illustrating the positional relationship of LED chips in a first light-emitting element column to a fourth light-emitting element column according to Embodiment 2.

FIG. 9 is a plan view illustrating the positional relationship of LED chips 12 in first light-emitting element: column N21 to fourth light-emitting element column N24 according to Embodiment 2.

As illustrated in FIG. 9, distance H22 between adjacent LED chips 12 in the column direction (along the Y-axis) is the same as distance H21 between adjacent LED chips 12 in the row direction (along the X-axis). This relationship holds true with all LED chips 12 within sealing region S. Thus, column-wise distance H22 and row-wise distance H21 between LED chips 12 are the same, allowing the flow paths for the light-transmissive resin material forming sealing member 13 to be uniformed. With this, the light-transmissive resin material can flow evenly into entire sealing region S, allowing an increase in the degree of flatness of sealing member 13.

Note that the degree of flatness of sealing member 13 has an impact not only on distances H21 and H22, that is, the space between LED chips 12 that is a flow path for the light-transmissive resin material, but also on package density of LED chips 12. According to the inventor's finding, it is assumed that the following two conditions need to be met in order to improve the degree of flatness of sealing member 13. The first condition is to make total distances between LED chips 12 roughly equal. Specifically, a per-line total distance between LED chips 12 in the column or row direction (the number of spaces between LED chips 12 in one line, multiplied by the distance between LED chips 12 in the line) is set to a uniform value for every one of the lines.

The second condition is to make the package density of LED chips 12 within sealing region S roughly uniform. Note that to make the package density roughly uniform means placing LED chips 12 in a state of having no extreme difference in the package density thereof within sealing region S. When LED chips 12 are small, such LED chips 12 can be positioned evenly throughout sealing region S. However, when LED chips 12 are as large as a certain size, the attempt to evenly position such LED chips 12 inevitably results in a difference in the package density. Therefore, so long as two or more LED chips 12 are positioned evenly in sealing region S from a broad point of view, the package density of LED chips 12 may be regarded as roughly uniform.

Hereinafter, Comparative Examples 1 to 3 will be given to exemplify these conditions. In the descriptions of Comparative Examples 1 to 3, the layout of LED chips 12 within sealing region S is described.

Figure 10:
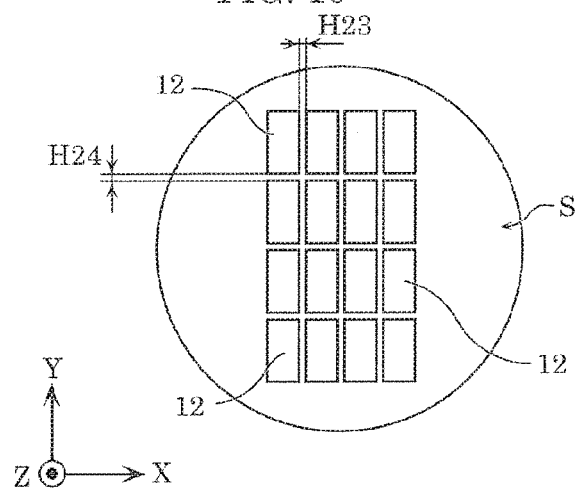
FIG. 10 is a plan view illustrating a layout of LED chips according to Comparative Example 1.

FIG. 10 is a plan view illustrating a layout of LED chips 12 according to Comparative Example 1.

As illustrated in FIG. 10, the layout according to Comparative Example 1 is four rows and four columns of LED chips 12. Furthermore, LED chips 12 are positioned in such a way that the longitudinal direction of each of these chips extends along the Y-axis. In Comparative Example 1, the number of spaces between LED chips 12 in each of the column direction and the row direction is three, and distances H23 and H24 therebetween are also the same, meaning that the total distance between LED chips 12 in every line the row direction and the column direction is uniform.

The package density of LED chips 12 within sealing region S is high in the center and low in the periphery, that is, is non-uniform.

Thus, Comparative Example 1 meets the first condition only. With the layout according to Comparative Example 1, sealing member 13 has a low degree of flatness with a difference in surface shape between a region in which LED chips 12 are mounted and a surrounding region thereof.

Figure 11:
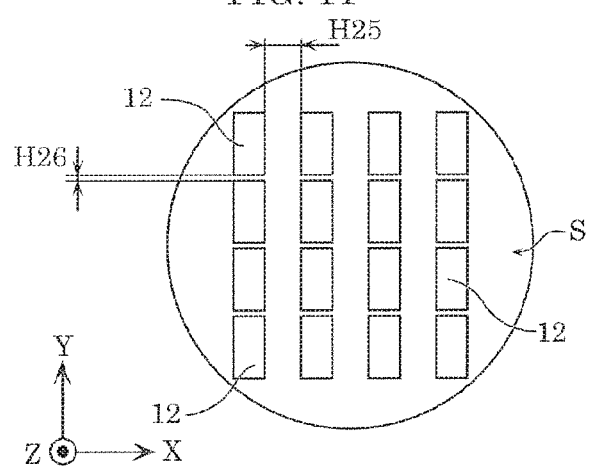
FIG. 11 is a plan view illustrating a layout of LED chips according to Comparative Example 2.

FIG. 11 is a plan view illustrating a layout of LED chips 12 according to Comparative Example 2.

As illustrated in FIG. 11, the layout according to Comparative Example 2 is four rows and four columns of LED chips 12. Furthermore, LED chips 12 are positioned in such a way that the longitudinal direction of each of these chips extends along the Y-axis. In Comparative Example 2, the package density of LED chips 12 within sealing region S is roughly uniform.

In Comparative Example 2, the number of spaces between LED chips 12 in each of the column direction and the row direction is three, but distances H25 and H26 therebetween are different, meaning that the total distance between LED chips 12 in every line in the row direction and the column direction is not uniform.

Thus, Comparative Example 2 meets the second condition only. With the layout according to Comparative Example 2, distance H25 is large and distance H26 is small, and therefore there is a difference in flow of the light-transmissive resin material, resulting in sealing member 13 having a difference in surface shape and thus having a low degree of flatness.

Figure 12:
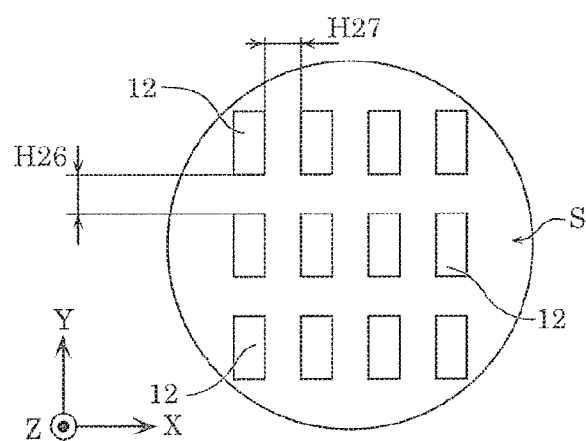
FIG. 12 is a plan view illustrating a layout of LED chips according to Comparative Example 3.

FIG. 12 is a plan view illustrating a layout of LED chips 12 according to Comparative Example 3.

As illustrated in FIG. 12, the layout according to Comparative Example 3 is three rows and four columns of LED chips 12. Furthermore, LED chips 12 are positioned in such a way that the longitudinal direction of each of these chips extends along the Y-axis. In Comparative Example 3, the package density of LED chips 12 within sealing region S is roughly uniform.

In Comparative Example 3, distances H26 and 1127 between LED chips 12 in the column direction and in the row direction are the same, but the number of LED chips 12 is two in the column direction and three in the row direction. Thus, the total distance between LED chips 12 in every line in the row direction and the column direction is not uniform.

Thus, Comparative Example 3 meets the second condition only. With the layout according to Comparative Example 3, the number of spaces between LED chips 12 is two in the column direction and three in the row direction. Therefore, the light-transmissive resin material flows easily in the row direction to the edge of sealing region S, but flows less easily in the column direction to the edge of sealing region S. This results in sealing member 13 having a low degree of flatness with a difference in surface shape.

As just described, in the case where the directions of all LED chips 12 are the same, the two conditions cannot be met in practice.

In light-emitting apparatus 20 according to Embodiment 2, LED chips 12 are provided in four rows and four columns as illustrated in FIG. 9. And the first light-emitting element and the second light-emitting element are arranged alternately throughout every one of two or more light-emitting element columns N21 to N24, that is, every column. Furthermore, the first light-emitting element and the second light-emitting element are arranged alternately throughout every row as well. The arrangement of LED chips 12 as just described allows the total distance between LED chips 12 to be roughly equal and the package density of LED chips 12 within sealing region S to be roughly uniform simultaneously. This means that the above-noted two conditions can be met, so that the light-transmissive resin material can flow evenly into entire sealing region S, allowing an increase in the degree of flatness of sealing member 13.

Embodiment 3

Figure 13:
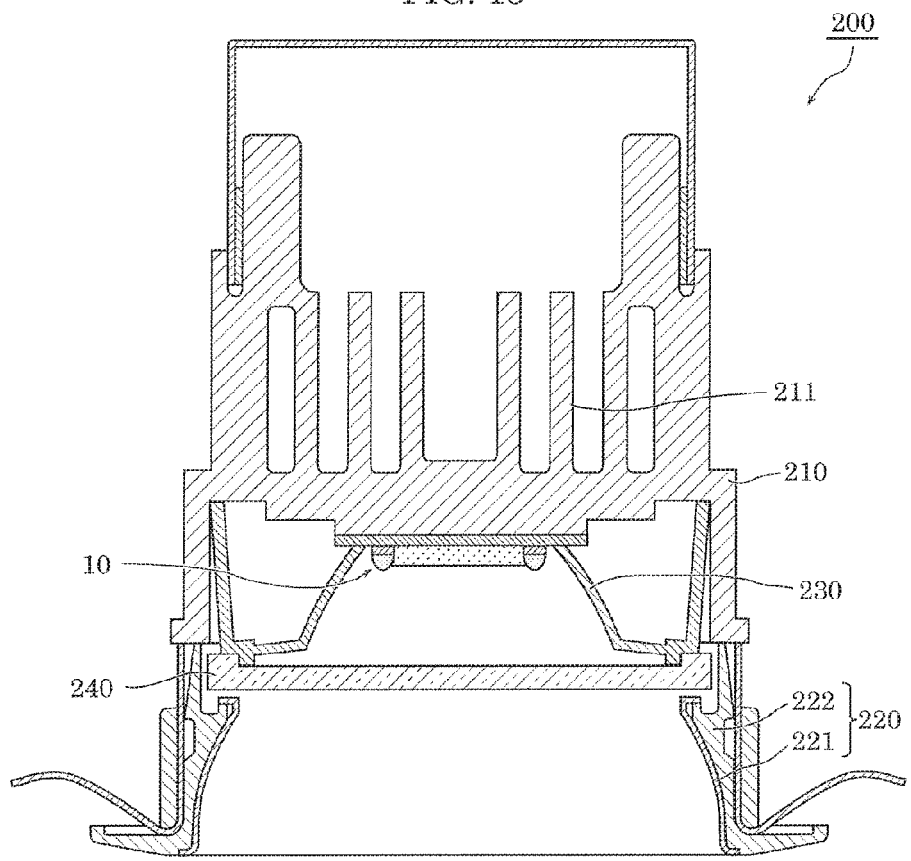
FIG. 13 is a cross-sectional view of an illumination apparatus according to Embodiment 3.
Figure 14:
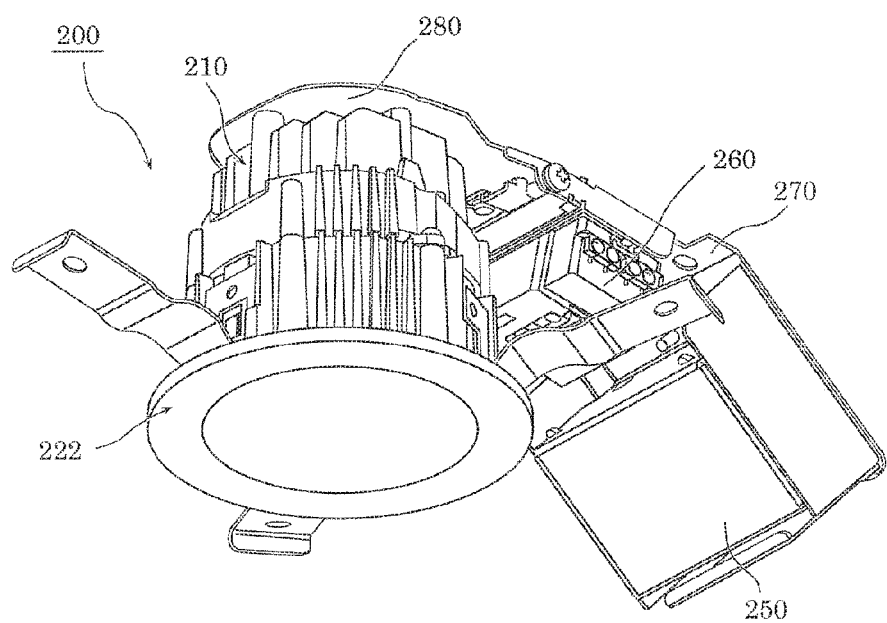
FIG. 14 is a perspective view of external appearances of an illumination apparatus and peripheral members thereof according to Embodiment 3.

Next, illumination apparatus 200 according to Embodiment 3 is described with reference to FIG. 13 and FIG. 14. FIG. 13 is a cross-sectional view of illumination apparatus 200 according to Embodiment 3. FIG. 14 is a perspective view of external appearances of illumination apparatus 200 and peripheral members thereof according to Embodiment 3.

As illustrated in FIG. 13 and FIG. 14, illumination apparatus 200 according to Embodiment 3 is a sunken illumination apparatus, such as a recessed light, that emits light downward (toward the floor or a wall, for example) by being installed, for example, in the ceiling of a house.

Illumination apparatus 200 includes light-emitting apparatus 10. Illumination apparatus 200 further includes an apparatus body in the shape of a substantial bottomed tube formed by joining pedestal 210 and frame 220, and reflection plate 230 and light-transmissive panel 240 disposed on this apparatus body.

Pedestal 210 is an attachment base to which light-emitting apparatus 10 is attached, and also serves as a heat sink for dissipating heat generated by light-emitting apparatus 10. Pedestal 210 is formed into a substantially columnar shape using a metal material and is, in Embodiment 3, made of die-cast aluminum.

Two or more heat-dissipating fins 211 are provided at predetermined intervals along one direction on the top portion (ceiling-side portion) of pedestal 210 so as to protrude upward. With this, heat generated by light-emitting apparatus 10 can be efficiently dissipated.

Frame 220 includes: cone portion 221 including a reflective surface on an inner surface and having a substantially circular tube shape; and frame body 222 to which cone portion 221 is attached. Cone portion 221 is formed using a metal material and can, for example, be formed of an aluminum alloy or the like by metal spinning or pressing. Frame body 222 is formed of a hard resin material or a metal material. Frame 220 is fixed by frame body 222 being attached to pedestal 210.

Reflection plate 230 is a circular-annular-frame-shaped (funnel-shaped) reflection member having an inner surface reflection function. For example, reflection plate 230 can be formed using a metal material such as aluminum. Note that reflection plate 230 may be formed using a hard white resin material instead of a metal material.

Light-transmissive panel 240 is a light-transmissive member having light-diffusing properties and light-transmitting properties. Light-transmissive panel 240 is a at plate disposed between reflection plate 230 and frame 220, and is attached to reflection plate 230. For example, light-transmissive panel 240 can be formed into a disc shape using a transparent resin material such as acrylic or polycarbonate.

Note that illumination apparatus 200 is not required to include light-transmissive panel 240. Without light-transmissive panel 240, illumination apparatus 200 allows an improvement in the luminous flux of light that is output therefrom.

Furthermore, as illustrated in FIG. 14, lighting apparatus 250 which supplies lighting power to light-emitting apparatus 10, and terminal base 260 which relays AC power from a commercial power supply to lighting apparatus 250 are connected to illumination apparatus 200.

Lighting apparatus 250 and terminal base 260 are fixed to attachment plate 270 provided separately from the apparatus body. Attachment plate 270 is formed by folding a rectangular plate member made of a metal material, and has one longitudinal end the bottom surface of which lighting apparatus 250 is fixed to and the other longitudinal end the bottom surface of which terminal base 260 is fixed to. Attachment plate 270 is connected together with top plate 280 which is fixed to a top portion of pedestal 210 of the apparatus body.

In illumination apparatus 200 as a result of including light-emitting apparatus 10, the occurrence of disconnection of a wire and the generation of uneven color due to unevenness of the surface of sealing member 13 are reduced. Thus, it can be said that illumination apparatus 200 is highly reliable.

Although the illumination apparatus is exemplified as a recessed light in Embodiment 3, the illumination apparatus according to the present disclosure may be implemented as a spotlight or a different illumination apparatus.

Other Embodiments

Although light-emitting apparatus 10, the method of manufacturing the same, and illumination apparatus 200 according to the embodiments have been described above, the present disclosure is not limited to the above-described embodiments.

For example, the above embodiments have described the examples in which the longitudinal directions of the first light-emitting element and the second light-emitting element in mixture region R are perpendicular to each other. However, it is sufficient that the angle formed between the longitudinal direction of the first light-emitting element and the longitudinal direction of the second light-emitting element is not zero degree or 180 degrees. Specifically, it is sufficient that the angle formed between the virtual straight line and the longitudinal direction of the first light-emitting element (the first angle) is at least different from the angle formed between the virtual straight line and the longitudinal direction of the second light-emitting element (the second angle). The angle formed between the longitudinal direction of the first light-emitting element and the longitudinal direction of the second light-emitting element can be determined based on various experiments, simulation, experimental rules of operators, and so on. In addition, this angle may be different at each position of mixture region R.

Furthermore, although COB light-emitting apparatus 10 has been described in the above embodiments, the present disclosure is applicable to a SMD (surface mount device) light-emitting apparatus as well.

Furthermore, in the above embodiments, light-emitting apparatus 10 outputs white light using a combination of LED chip 12 that emits blue light with yellow phosphor 14, but the configuration for emitting white light is not limited to that described above.

For example, a phosphor-containing resin that contains a red phosphor and a green phosphor may be combined with LED chip 12. Alternatively, an ultraviolet LED chip that outputs ultraviolet light having a wavelength shorter than that of light output from LED chip 12 may be combined with a blue phosphor, a red phosphor, and a green phosphor that output blue light, red light, and green light, respectively, as a result of being excited mainly by ultraviolet light.

Furthermore, in the above embodiments, LED chip 12 mounted on substrate 11 is connected to another LED chip 12 in a chip-to-chip configuration by bonding wire 17. However, LED chip 12 may be connected by bonding wire 17 to wiring 16 (a metal film) provided on substrate 11, and thus electrically connected to another LED chip 12 via wiring 16.

Furthermore, the light-emitting element to be used in light-emitting apparatus 10 is exemplified as LED chip 12 in the above embodiments. However, a semiconductor light-emitting element, such as a semiconductor laser, or another type of solid-state light-emitting element, such as an electroluminescent (EL) element including an organic or inorganic EL material, may be used as the light-emitting element.

Furthermore, light-emitting elements of two or more types different in light-emission color may be used in light-emitting apparatus 10. For example, light-emitting apparatus 10 may include an LED chip that emits red light in addition to LED chip 12 for the purpose of increasing color rendering properties.

While the foregoing has described one or more embodiments, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light-emitting apparatus comprising:
    a substrate;
    a plurality of light-emitting elements mounted on the substrate and each having a rectangular shape in a plan view of the substrate;
    a wiring provided on the substrate for supplying electric power to the plurality of light-emitting elements;
    a dam member provided on the substrate and surrounding the plurality of light-emitting elements; and
    a sealing member filling a region surrounded by the dam member, and sealing the plurality of light-emitting elements,
    wherein the plurality of light-emitting elements are arranged in a plurality of light-emitting element columns,
    in at least one of the plurality of light-emitting element columns, the plurality of light-emitting elements are all positioned on a virtual straight line,
    the wiring includes a plurality of connectors electrically connected to the plurality of light-emitting element columns, the plurality of connectors extending into the region surrounded by the dam member,
    each of the plurality of connectors is connected via a wire to only one of the plurality of light-emitting elements, and
    the plurality of light-emitting elements in the at least one of the plurality of light-emitting element columns include at least one set of a first light-emitting element and a second light-emitting element that are positioned adjacent to each other, the first light-emitting element being disposed to form a first angle between the virtual straight line and a longitudinal direction of the first light-emitting element, and the second light-emitting element being disposed to form a second angle different from the first angle between the virtual straight line and a longitudinal direction of the second light-emitting element.

2. The light-emitting apparatus according to claim 1, wherein the longitudinal direction of the first light-emitting element disposed and the longitudinal direction of the second light-emitting element disposed are perpendicular to each other.

3. The light-emitting apparatus according to claim 1, wherein the first light-emitting element and the second light-emitting element are arranged alternately throughout the at least one of the plurality of light-emitting element columns.

4. The light-emitting apparatus according to claim 3, wherein the plurality of light-emitting elements arranged in the plurality of light-emitting element columns are the first light-emitting element and the second light-emitting element that are arranged alternately throughout each of the plurality of light-emitting element columns.

5. The light-emitting apparatus according to claim 1, wherein the plurality of light-emitting element columns are spaced apart in a row direction, and at least one set of the first light-emitting element and the second light-emitting element are adjacent to each other in the row direction.

6. The light-emitting apparatus according to claim 5, wherein the first light-emitting element and the second light-emitting element are arranged alternately throughout a row of the plurality of light-emitting elements.

7. The light-emitting apparatus according to claim 5, wherein a distance between the first light-emitting element and the second light-emitting element that are adjacent to each other in a column direction is equal to a distance between the first light-emitting element and the second light-emitting element that are adjacent to each other in the row direction.

8. An illumination apparatus comprising the light-emitting apparatus according to claim 1.

9. The light-emitting apparatus according to claim 1, wherein both end portions of at least one of the plurality of light-emitting element columns are disposed between adjacent connectors among the plurality of connectors.

10. The light-emitting apparatus according to claim 1, wherein the plurality of connectors are electrically connected one-to-one to end portions of the plurality of light-emitting element columns.

\* \* \* \* \*